United States Patent [19]

Okada et al.

[11] Patent Number: 5,300,619
[45] Date of Patent: Apr. 5, 1994

[54] POLYIMIDE RESIN FILM AND METHOD OF MAKING SAID FILM

[75] Inventors: Koji Okada; Yoshihide Ohnari; Toshinori Mizuguchi; Junichi Hazama, all of Otsu, Japan

[73] Assignee: Kanegafuchi Kagaku Kogyo Kabushiki Kaisha, Osaka, Japan

[21] Appl. No.: 820,864

[22] PCT Filed: May 20, 1991

[86] PCT No.: PCT/JP91/00673
§ 371 Date: Mar. 18, 1992
§ 102(e) Date: Mar. 18, 1992

[87] PCT Pub. No.: WO91/17880
PCT Pub. Date: Nov. 28, 1991

[30] Foreign Application Priority Data

May 21, 1990 [JP] Japan .................. 2-132068

[51] Int. Cl.$^5$ .................. C08G 73/00; B32B 27/00
[52] U.S. Cl. .................. 528/170; 264/290.2; 264/291; 264/292; 264/DIG. 73; 428/473.5; 428/910; 528/228; 528/350; 528/353
[58] Field of Search .................. 428/473.5, 910; 264/DIG. 73, 290.2, 291, 292; 528/170, 228, 350, 353

[56] References Cited

U.S. PATENT DOCUMENTS

| | | | |
|---|---|---|---|
| 4,499,042 | 2/1985 | Ishizuka et al. | 264/205 |
| 4,725,484 | 2/1988 | Kumagawa et al. | 428/220 |
| 5,196,500 | 3/1993 | Kreuz et al. | 528/125 |
| 5,202,411 | 4/1993 | Itatani | 528/353 |

Primary Examiner—Paul J. Thibodeau
Assistant Examiner—H. Thi Le
Attorney, Agent, or Firm—Cushman, Darby & Cushman

[57] ABSTRACT

A resin film useful mainly for fabricating flexible printed circuits, and a method of producing same. In the process of fabricating a flexible printed circuit board, a copper foil(2) is thermally bonded to a resin film(1), and the copper foil(2) is then etched to a predetermined pattern, in which case the board is generally subject to some dimensional change. In order to minimize such dimensional change it is arranged that the ratio(a/b) of the linear expansion coefficient(a) of the resin film(1) in the direction of mechanical feed(MD direction) to the linear expansion coefficient(b) of the resin film(1) in a direction perpendicular to the MD direction (TD direction) is more than 0.2 but less than 1.0 and that the linear expansion coefficient in MD direction is $0.4$–$2.0 \times 10^{-5}$ $°^{-1}$. For such resin film is used a polyimide film containing more than 90% of a recurring unit expressed by a specified general formula. To produce such a resin film, film 1 is drawn by a factor of from 1.0 to 1.5 in MD direction and is also drawn by a factor of from 0.5 to 0.99 in TD direction.

2 Claims, 1 Drawing Sheet

POLYIMIDE RESIN FILM AND METHOD OF MAKING SAID FILM

TECHNICAL FIELD

The present invention relates to a resin film and method of producing said film and, more particularly, to a polyimide film having good dimensional stability and suitable for use as a base film for flexible printed circuit boards, and a method of producing said film.

BACKGROUND ART

In the art of electronics, needs for high density packaging are increasing greatly, and accordingly in those technical areas in which flexible printed circuit boards (hereinafter referred to as FPC) are employed, need for high density packaging are becoming greater as well. In the process of producing FPC, film dimensions are liable to appreciable changes at the stage of etching, at which the copper foil stuck on the base film is etching as the required pattern, and/or at an adjacent stage. Therefore, it is required that dimensional changes before and after such stage are minimized in order to enable high density packaging.

Hitherto, polyimide films have been used as a base film for FPC. Of these films, polyimide films having good handling property and flexibility have a smaller modulus of elasticity and a greater linear expansion coefficient. So, these polyimide films have not been satisfactory enough to meet the needs for high density packaging. A polyimide having a smaller linear expansion coefficient and a greater modulus of elasticity can be synthesized, but such polyimide film is much less flexible and can hardly be used as FPC. A polyimide film which have good dimensional stability with low thermal shrinkage and low linear expansion coefficient is produced by film drawing. It is disclosed in Japanese Patent Application Laid-Open Publication No.61-296034, but this polyimide film has not yet had mechanical properties, such as sufficient elongation.

FPC fabrication is carried out on a roll-to-roll basis such that FPC base film and copper foil, both are wound on respective rolls, are paid out respectively and heated for being laminated together. Because of this, both base film and copper foil are subjected to tension in the direction of being fed from the respective rolls, that is, in the mechanical feeding direction( hereinafter referred to as MD direction), and under such conditions FPC has been produced.

Then we'll consider the base film. In MD direction it is subjected to both elongation under tension mentioned above and elongation due to thermal expansion under the heat applied during the stage of lamination. On the other hand, there occurs a phenomenon that the film shrinks in a direction perpendicular to the Mechanical feeding direction by an amount corresponding to the amount of its elongation in MD direction due to the tension. Accordingly, in TD (transverse direction) direction shrinkage is given to the film.

The copper foil is little subjected to deformation under the tension applied in the usual process of FPC making, because the copper foil has a very large modulus of elasticity. It is only through thermal expansion under heat applied during the stage of lamination that the copper foil is deformed. Thus, elongation due to thermal expansion in both MD and TD directions is given to the copper foil.

Therefore, if the sum of elongation of the film due to the tension and elongation of the film due to thermal expansion in MD direction is equal to the elongation of the copper foil due to thermal expansion, the distortion are set off against each other. Likewise, in the TD direction if the sum of shrinkage of the film in TD direction due to film's elongation under tension in MD direction and elongation of the film in TD direction due to thermal expansion is equal to the elongation of the copper foil due to thermal expansion, the distortion are set off against each other.

However, since the base film and the copper foil are isotropically produced, an FPC, where both base film and copper foil are laminated, remains considerably distorted in TD direction when the base film is secured to the copper film. Therefore, when the copper foil is removed by etching for pattern formation, the strain which has been locked is released and accordingly there will occur considerable dimensional changes before and after the stage of etching, which can seriously hinder high density packaging.

Therefore, the present inventors directed their research efforts toward developing a resin film, particularly a polyimide film which is little liable to dimensional changes before and after the stage of etching in the process of FPC fabricating, and a method of making same. As a result, this invention was arrived at.

DISCLOSURE OF THE INVENTION

The resin film in accordance with the invention is characterized in that the ratio(a/b) of the linear expansion coefficient(a) of the film in the direction of mechanical feed thereof to the linear expansion coefficient(b) in a direction perpendicular to said direction of mechanical feed is more than 0.2 but less than 1.0, and in that the linear expansion coefficient in said direction of mechanical feed is $0.4 - 2.0 \times 10^{-5}$ °C$^{-1}$.

The resin film is further characterized in that the film is a polyimide film containing more than 90% of a recurring unit expressed by the general formula :

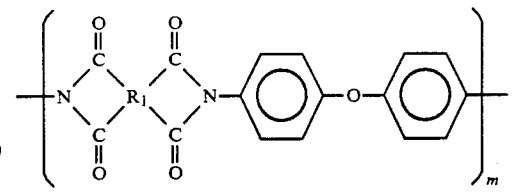

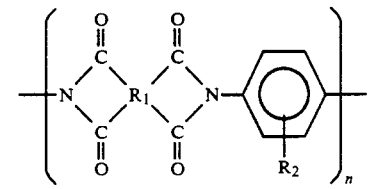

where, R$_1$ represents

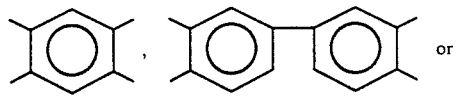

-continued

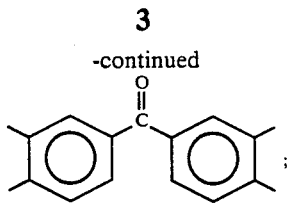

R$_2$ represents a hydrogen atom or a univalent substituent; and m, n represent integral numbers, m/n assuming a value of from 0.1 to 100.

A method of producing the resin film or, in particular, the polyimide film that are described above, is characterized in that the film is drawn by a factor of 1.0 to 1.5 in the direction of mechanical feed thereof and is also drawn by a factor of 0.5 to 0.99 in a direction perpendicular to the direction of mechanical feed.

BEST MODE FOR CARRYING OUT THE INVENTION

The invention will now be described in detail. On the following description, what has been stated above is omitted.

Before and after the stage of etching in the process of FPC (flexible printed circuit) fabricating, in order to minimize possible dimensional change of FPC, it is essential that the resin film as a base film should be produced so as to satisfy the following conditions.

Figure 1:
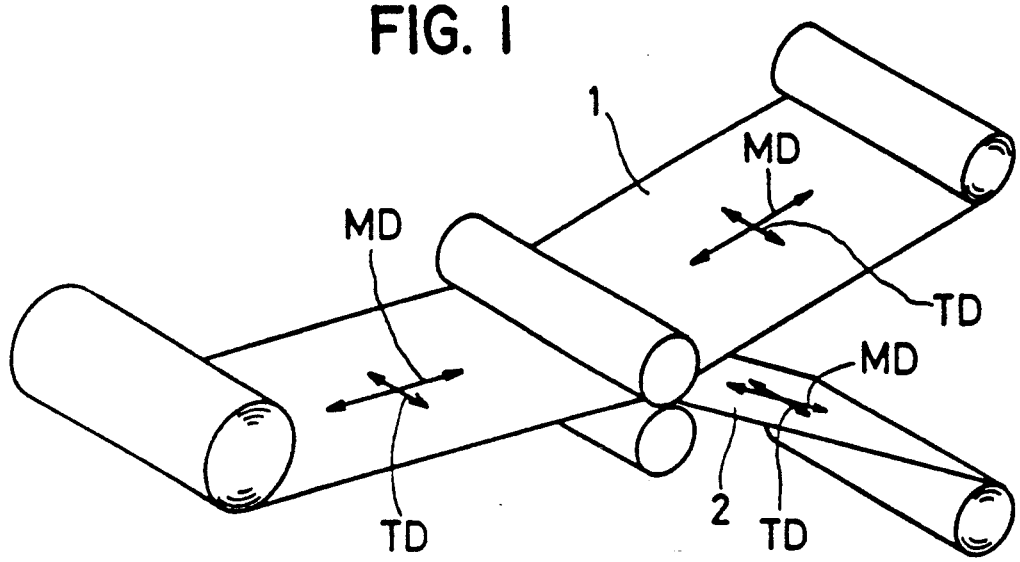
FIG. 1 is a perspective view illustrating the method of producing a resin film according to the invention.

As FIG. 1 shows, in MD direction the sum of the stretch of film 1 by tension and the elongation of film 1 by thermal expansion is equal to the elongation of copper foil 2 by thermal expansion, and in TD direction the sum of the shrinkage of film 1 by being drawn under tension in MD direction and the elongation of film 1 by thermal expansion is equal to the elongation of copper foil 2 by thermal expansion. In other words, it is necessary that the following equations are satisfied.

---

MD direction: (stretch of the film by tension) +
(elongation of the film by thermal expansion) =
(elongation of the copper foil by thermal expansion)
TD direction: (shrinkage of the film by being drawn in MD direction) +
(elongation of the film by thermal expansion) =
(elongation of the copper foil by thermal expansion)

---

In order to meet these conditions, it is desirable that the linear expansion coefficient of film 1 is smaller in MD direction and greater in TD direction, or more specifically that the ratio(a/b) of the MD directional linear expansion coefficient(a) to the TD directional linear expansion coefficient(b) is more than 0.2 but less than 1.0, more preferably, more than 0.2 but less than 0.8, and still more preferably, more than 0.25 but less than 0.6. By the way it is allowable that the ratio (a/b) may be less than 0.2; as a matter of fact, however, it is difficult to produce a film 1 having such anisotropy. The term "linear expansion coefficient" used herein refers to a linear expansion coefficient at 100°-200° C.

It is desirable that the MD directional linear expansion coefficient(a) may be less than the linear expansion coefficient of copper (about $1.68 \times 10^{-5}$ °C.$^{-1}$). Preferably, it is more than $0.5 \times 10^{-5}$ °C.$^{-1}$ but less than $2.0 \times 10^{-5}$ °C.$^{-1}$, more preferably more than $0.5 \times 10^{-5}$ °C.$^{-1}$ but less than $1.8 \times 10^{-5}$ °C.$^{-1}$ and much more preferably more than $0.6 \times 10^{-6}$ °C.$^{-1}$ but less than $1.4 \times 10^{-5}$ °C.$^{-1}$. The MD directional linear expansion coefficient(a) may be less than $0.5 \times 10^{-5}$ °C.$^{-1}$, but generally a film 1 having a lower linear expansion coefficient is not so desirable. Because it has a higher modulus of elasticity and a smaller elongation in tension, so that the sum of the stretch of film 1 under tension and the elongation of film 1 under thermal expansion is considerably smaller than the elongation of copperfoil 2 under thermal expansion.

Such anisotropy of film 1 with respect to its linear expansion coefficients in MD and TD direction can be obtained by arranging that, in the process of film production, film 1 is drawn in MD direction by a factor of 1.0 to 1.5, preferably 1.1 to 1.4, more preferably 1.1 to 1.3, and is also drawn in TD direction by a factor of 0.5 to 0.99, preferably 0.6 to 0.9, more preferably 0.6 to 0.8.

Figure 2:
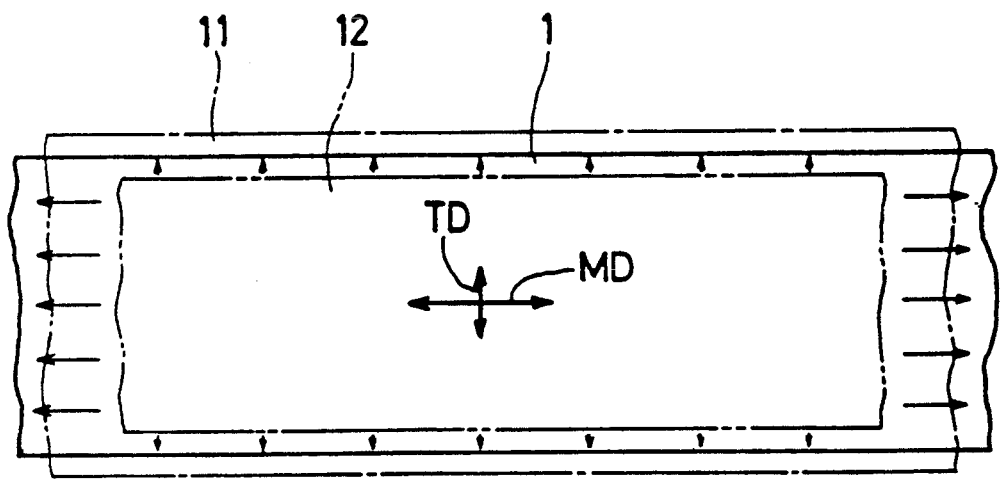
FIG. 2 is an explanatory view illustrating the manner in which the resin film is drawn in the method for producing the resin film according to the invention.

The method of producing film 1 will be explained in detail A reaction—hardening type resin film, such as a polyimide film or polyamide film, is formed by casting or coating a precursor on an endless belt or casting drum, and it is reaction—hardened until it has at least self-supporting, then it is separated from the belt or drum. Then as FIG. 2 shows, the separated self-supporting film 11 is further reaction-hardened with its ends being held in position and, meanwhile, any reaction product solvent residue are removed by evaporation. During this process, the film is contracted not only in the direction of film thickness, but also in MD and TD directions (to such condition as shown by two-dot chain lines in FIG.2). Therefore, the film is drawn by each predetermined factors as against the original film 11 dimension.

The film 1 produced by such method has different values with respect to its linear expansion coefficients in MD direction and TD direction respectively, which generally satisfy the foregoing equations. Therefore, an FPC produced by using such film has little dimensional change before and after the stage of etching, which means the FPC provides for higher density packaging.

Such a resin film 1 having different linear expansion coefficient in MD and TD directions respectively is not limited to polyimide film or polyamide film, and the method of producing such film 1 is equally applicable to reaction-hardening type resin films. Most preferred modes for carrying out the invention will be described hereinafter.

A preferred polyimide film according to the invention contains more than 90% of a recurring unit expressed by the general formula:

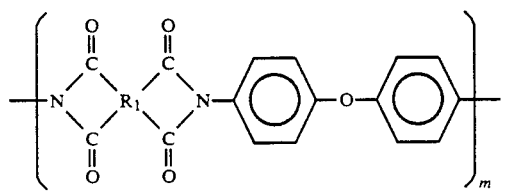

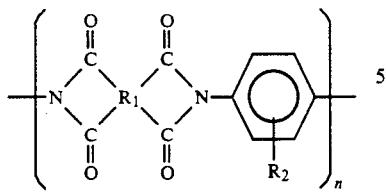

where, R₁, represents

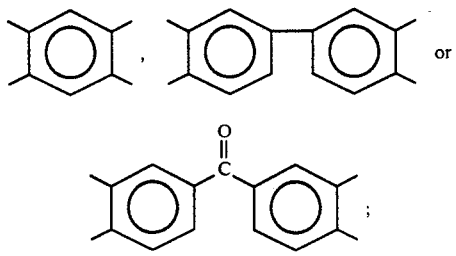

R₂ represents a hydrogen atom or a monovalent substituent, and m,n represent integral numbers, m/n is assuming a value of 0.1 to 100.

Aromatic tetracar-boxylic acids useful in the practice of the invention are pyromellitic acid or acid dianhydride thereof, 3,3',4,4' - biphenyl tetracarboxylic acid or acid dianhydride thereof, and 3,3',4,4' - benzophenone tetracarboxylic acid or acid dianhydride thereof. It is also allowable however, that 2,3,3',4' - biphenyl tetracarboxylic acid or acid dianhydride thereof ; 2,2',3,3' - biphenyl tetracarboxylic acid or acid dianhydride thereof; naphthalene - 1,2,5,6 - tetracarboxylic acid or acid dianhydride thereof; naphthalene - 2,3,6,7 - tetracarboxylic acid or acid dianhydride thereof; 2,3,3',4'- benzophenone tertracarboxylic acid or acid dianhydride thereof, or acid derivatives, such as esterifides and acid chlorides, of these acids may be partly used.

Methods of preparing a solution of a polyamic acid copolymer as a precursor of a polyimide copolymer are shown below by way of example. Other polyimide copolymers may be used, but the below mentioned polyimide copolymers are preferably used because of their advantageous properties.

(1) An aromatic tetracarboxylic acid dianhydride(a) and aromatic diamines(b),(c) are caused to react with each other in a polar solvent so that the sum of (a),(b) and (c) is substantially equimolar. By this method is it possible to obtain a random copolymer.

(2) An aromatic diamine(b) is put in a polar solvent and then surplus aromatic tetracarboxylic acid dianhydride(a) is added at a stretch under cooling to obtain a prepolymer having acid anhydrous radical at both terminals. Then, an aromatic diamine(c) of an amount equivalent to ((a)-(b)) mol is added. By this method it is possible to obtain a copolymer such that recurring units are constant within the copolymer molecule.

Other methods may be employed to obtain a polyamic acid, or different kinds of polyamic acids may be used to mix. However it is preferable that the polyimide copolymer obtained according to method(2) above is used concerning physical properties.

Used as aromatic diamine components 4,4' -diaminodiphenylether and an aromatic diamine expressed by the general formula:

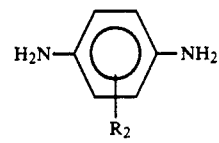

(R₂: same as earlier noted)

For aromatic diamines expressed by this general formula, the following may be enumerated : paraphenylenediamine , 1.4' - diamino -2-fluoro- benzene, 1,4'-diamino-2-chloro -benzene, 1,4' -diamino-2-bromo-benzene, 1,4' -diamino-2 -methyl-benzene, 1,4' -diamino-3-fluoro-benzene, 1,4' -diamino-3-chloro-benzene, 1,4' -diamino-3-bromo-benzene, 1,4' -diamino -3-methyl-benzene, 1,4' -diamino-2,6-difluoro -benzene, 1,4' -diamino-2,6-dichloro-benzene, 1,4' -diamino-2,6-dibromo-benzene, 1,4' -diamino-2,6-dimethyl -benzene, 1,4' -diamino-2,5-difluoro-benzene, 1,4' -diamino -2,5-dichloro -benzene, 1,4' -diamino-2,5-dibromo-benzene, 1,4' -diamino-2,5-dimethyl-benzene, 1,4' -diamino-2,3-difluoro -benzene, 1,4' -diamino-2,3-dichloro-benzine, 1,4' -diamino -2,3-dibromo-benzene, and 1,4' -diamino-2,3-dimethyl-benzene. Of these aromatic diamines, paraphenylenediamine is particularly preferred in respect of physical properties.

It is noted, however, that aromatic diamine compounds expressed by the general formula:

$H_2N—R—NH_2$ (where, R represents a divalent organic radical), for example, some of various polyvalent amine compounds may be used in part which include: 3,3' -dimethoxy- 4,4' -diaminobiphenyl, 3,3' -dimethyl-4,4' -diaminobiphenyl, 3,3' -dichloro- 4,4' -diaminobiphenyl, 4,4' - diaminoparata -phenyl-4,4' -bis(4-aminophenoxy) biphenyl, 4,4' diaminodiphenylsulfone, 3,3' -diaminodiphenylsulfone, bis [4-(4- aminophenoxy)phenyl]sulfone, bis[4-(3-aminophenoxy) phenyl]sulfone, bis[4-(2-aminophenoxy)phenyl]sulfone, 1,4-bis(4-amino-phenoxy)benzene, 1,3-bis(4-aminophenoxy)benzene, 1,3-bis(3-aminophenoxy)benzene, 1,4-bis(4-aminophenyl)benzene, bis[4-(4-aminophenoxy)phenyl] ether, 4,4' -diaminodiphenyl methane, bis(3-ethyl-4-aminophenyl)methane, bis(3-methal-4 -aminophenyl)methane, bis(3-chloro-aminophenyl)methane, 2,2',5,5' -tetrachloro-4,4' -diaminobiphenyl, 4,4' -diaminodiphenylsulfide, 3,3' -diaminodiphenylether, 3,4' -diaminodiphenylether, 4,4' -diaminodiphenylmethane, 4,4' -diaminobiphenyl, 4,4' -diamino -octafluorobiphenyl, 2,4' -diaminotoluene, metaphenylenediamine, 2,2-bis [4-(4-aminophenoxy)phenyl]propane, 2,2-bis[4-(4-aminophenoxy) phenyl]hexafluoropropane, 2,2' -bis(4-aminophenyl)propane, 2,2-bis(4-aminophenyl)hexafluoropropane, 2,2-bis(3-hydroxy -4-aminophenyl)propane, 2,2-bis(3-hydroxy-4-aminophenyl) hexafluoropropane, 9,9-bis(4-aminophenyl)-10-hydro-anthracene, orthotolidinesulfone, 3,3',4,4' -biphenyltetraamine, and 3,3',4,4' -tetraaminodiphenyl ether.

For organic polar solvents used in carrying out necessary polymerization reaction which is one of the process of producing an aromatic polyimide of the invention, we can mention some examples, thus, sulfoxide solvents, such as dimethylsulfoxide and diethylsulfoxide, formamide solvents, such as N,N-dimethylformamide and N,N-diethylformamide, acetoamide solvents, such as N,N-dimethylacetoamide and N,N-diethylacetoamide, pyrrolidone solvents, such as N-methyl-2-pyrrolidone and N-vinyl-2-pyrrolidone, phenolic solvents, such as phenol, o-,m-, or p-cresol, xylenol, phenol halide, and catechol, and hexamethyl sulfoamide, r-butyrolactone, etc. These are preferably used alone or in mixture. Aromatic hydrocarbons, such as xylene and toluene, may also be used. From a standpoint of ease of handling, it is suitable that the polyamic acid copolymer is dissolved 5 to 40% by weight, preferably 10 to 30% by weight in the aforementioned organic polar solvent.

The aromatic polyimide in accordance with the invention is used in such a way that its precursor (an aromatic polyamic acid) is dissolved in an organic polar solvent into a solution(varnish), which solution is cast on a substrate, e.g., an endless belt or a carrier film, then the cast solution being dried at about 50° to 150° C. for about 1 to 60 minutes to remove the solvent. A self-supporting polyamic acid film is thus obtained. Before the varnish is cast on the substrate, endless belt, the varnish may be mixed with more than stoichiometric quantity of a dehydrating agent and a catalytic quantity of a tertiary amine in order to accelerate imidization. Or, imidization may be effected by heating only. The former method chemical dehydration of adding the dehydrating agent and a catalytic amount of tertiary amine is preferred from the standpoint of physical property consideration. For dehydrating agents useful in this connection, mention may be made of, for example, aliphatic anhydrides, such as acetic anhydride, and aromatic anhydrides. Useful catalysts include, for example, aliphatic tertiary amines, such as triethylamine, aromatic tertiary amines, such as dimethylaniline, and heterocyclic tertiary amines, such as pyridine, picoline, isoquinoline, and quinoline.

After having been separated from the substrate, the self-supporting polyamic acid film is secured at its ends by pins or the like and is drawn by a factor of 1.0 to 1.5 in MD direction and by a factor of 0.5 to 0.99 in TD direction while being subjected to heat treatment at temperatures of 50° to 550° C.

Thereafter, the self-supporting polyamic acid film is imidized by being heated gradually in a temperature range of about 100° to 550° C., cooled, and then the pins securing the film's ends are removed. Thus, an aromatic polyimide copolymer film according to the invention is obtained.

Having described preferred forms of the invention, it is believed obvious that various improvements, changes and modifications are possible in the light of the above teachings without departing from the spirit and scope of the invention, which are all embraced by the appended claims of the invention.

EXAMPLE 1

A predetermined quantity of DMF(dimethylformamide) and 0.36 mol of ODA (4,4' -diaminodiphenylether) were put in a 2-lit separable flask, and they were stirred at room temperature until ODA was completely dissolved. 0.6 mol of PMDA (pyromellitic anhydride) was gradually added to the solution which the solution was restrained from rising in temperature, a prepolymer is obtained. The proportion of DMF was controlled so as to obtain a monomer stock concentration of 18 wt % with respect to a diamino compound and a aromatic tetracarboxylic compound. 20 wt % of a solution of 0.24 mol P-PDA (paraphenylenediamine) dissolved in DMF was gradually added to obtain a polyamic acid solution.

The polyamic acid solution was mixed with more than a stoichiometric amount of acetic anhydride and a catalytic amount of tertiary amine, and then the mixture was coated on a glass plate by casting and allowed to dry at about 80° C. for about 90 sec to form a polyamic acid film. The polyamic acid film was then separated from the glass plate. The separated film was secured to a support frame and heated at about 100 C for about 90 sec. Thereafter, the film was drawn by a factor of 1.3 in MD direction and by a factor of 0.6 in TD direction.

Subsequently the drawn film was heated at about 250° C. for about 30 sec, at about 300° C. for about 30 sec, at about 400° C. for 30 sec, at about 450° C. for about 30 sec, and finally at about 500° C. for about 3 min. As a result, a polyimide copolymer film of about 25 micron was obtained.

A flexible printed circuit board (FPC) was fabricated using the obtained polyimide copolymer film, and meanwhile the FPC was examined as to its dimensional changes prior to and after the stage of etching. The examination results and linear expansion coefficients of the polyimide copolymer film in MD and TD directions are shown in Table 1.

Dimensional changes of FPC before and after etching were measured in accordance with the method of IPC-FC-241A. For measurement of linear expansion coefficients, a thermomechanical analysis apparatus, model TAS-100, made by Rigaku Denki Kabushiki Kaisha, was employed under the following conditions: rate of temperature rise, 10° C./min ; and temperature range, 100° to 200° C. Calculation was made according to the following equation.

Linear expansion coefficient =

$$\frac{\text{Increment in length due to expansion}}{\text{Length at 23° C.}} \times 100$$

TABLE 1

| Example | Anhydride Component | Diamine Components (molar ratio) | Factors of drawing MD/TD | Dimensional changes before/after etching MD/TD (%) | Linear expansion coefficient ($\times 10^{-5}$ °C.$^{-1}$) MD/TD |
|---|---|---|---|---|---|
| Example 1 | PMDA | p-PDA/ODA 40/60 | 1.3/0.6 | 0.01/0.00 | 0.6/1.8 |
| Example 2 | PMDA | p-PDA/ODA 40/60 | 1.2/0.8 | 0.04/0.07 | 0.7/1.3 |
| Example 3 | PMDA | p-PDA/ODA 40/60 | 1.0/0.9 | 0.06/0.09 | 0.8/1.0 |
| Comp. | PMDA | p-PDA/ODA | 1.0/1.0 | 0.06/0.14 | 0.8/0.8 |

TABLE 1-continued

| Example | Anhydride Component | Diamine Components (molar ratio) | Factors of drawing MD/TD | Dimensional changes before/after etching MD/TD (%) | Linear expansion coefficient ($\times 10^{-5}$ °C.$^{-1}$) MD/TD |
|---|---|---|---|---|---|
| Example 1 | | 40/60 | | | |
| Example 4 | BPDA | p-PDA/ODA 25/75 | 1.3/0.6 | 0.03/0.03 | 1.3/2.3 |
| Comp. Example 2 | PMDA | ODA | 1.3/0.6 | 0.12/0.04 | 2.5/4.0 |

ODA; 4,4'-diaminodiphenylether
p-PDA; paraphenylene diamine
PMDA; pyromellitic dianydride
BPDA; 3,3',4,4'-biphenyltetracarboxylic dianhydride
DMF; dimethylformamide

EXAMPLE 2

A polyimide copolymer film was produced in same manner as in Example 1, except that the polyamic acid film separated from the glass plate was drawn by a factor of 1.2 in MD direction and by a factor of 0.8 in TD direction.

A flexible printed circuit board (FPC) was fabricated using the obtained polyimide copolymer film, and meanwhile the FPC was examined as to its dimensional changes before and after the stage of etching. The examination results and linear expansion coefficients of the polyimide copolymer film in MD and TD directions are shown in Table 1.

EXAMPLE 3

A polyimide copolymer film was produced in same way as in Example 1, except that the polyamic acid film separated from the glass plate was drawn by a factor of 1.0 in MD direction and by a factor of 0.9 in TD direction.

A flexible printed circuit board(FPC) was fabricated by using the obtained polyimide copolymer film, and the FPC was examined as to its dimensional changes before and after the stage of etching. The examination results and linear expansion coefficients of the polyimide copolymer film in MD and TD directions are shown in Table 1.

COMPARATIVE EXAMPLE 1

A polyimide copolymer film was produced in same manner as in Example 1, except that the film was maintained at its original dimensions in both MD and TD directions.

In same way as in Example 1, a flexible printed circuit board(FPC) was fabricated using the obtained polyimide copolymer film, and meanwhile the FPC was examined as to its dimensional changes before and after the stage of etching. The examination results and linear expansion coefficients of the polyimide copolymer film in MD and TD directions are shown in Table 1.

EXAMPLE 4

DMF(dimethylformamide) was put in a 2-lit separable flask, and ODA(4,4'-diaminodiphenyl ether) and p-PDA(paraphenylenediamine) were added so that they were in a molar ratio of 25:75. The mixture was stirred at room temperature until the diamino compound was completely dissolved. The solution was polymerized with BPDA(3,3',4,4'-biphenyl tetracarboxylic dianhydride, and 18 wt % polyamic copolymer solution was thus obtained. A polyimide copolymer film of about 25 micron was obtained using the polyamic copolymer solution in same manner as in Example 1.

Similarly, a flexible printed circuit board (FPC) was fabricated by using the obtained polyimide copolymer film, and meanwhile the FPC was examined as to its dimensional changes before and after etching. The examinations results and linear expansion coefficients of the polyimide copolymer film in MD and TD directions are shown in Table 1.

COMPARATIVE EXAMPLE 2

ODA and PMDA are copolymerized in DMF in same manner as in Example 1 and, as a result, a solution of 18 wt % polyamic acid was obtained. A polyimide copolymer film of about 25 micron was obtained by using the polyamic acid solution in same manner as in Example 1.

Similarly, a flexible printed circuit board (FPC) was fabricated using the obtained polyimide copolymer film and, meanwhile, the FPC was examined as to its dimensional changes at end of etching as compared with the pre-etching dimensions. The examination results and linear expansion coefficients of the polyimide copolymer film in MD and TD directions are shown in Table 1.

INDUSTRIAL APPLICABILITY

The resin film and, in particular, polyimide film, in accordance with the invention is such that the linear expansion coefficient of the film in the direction of mechanical feed and that in a direction perpendicular to the direction of mechanical feed are different within a predetermined range. Therefore, in the process of fabricating a flexible printed circuit board(FPC), the film is less liable to dimensional change at the stage of etching. Accordingly, the resin film of the invention can be advantageously used as a base film for flexible printed circuit boards for higher density packaging.

The method of the invention is such that the film is drawn by each different factors in two perpendicular directions, so that a resin film has different linear expansion coefficients in each directions. According to the invention, high quality resin film can be obtained at lower cost.

What is claimed is:

1. A polyimide resin film containing more than 90 mol % of a recurring unit expressed by the general formula:

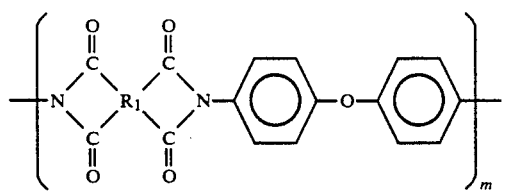

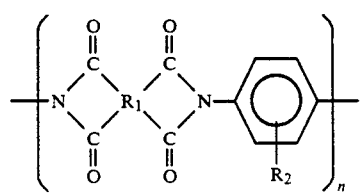

where, $R_1$ represents

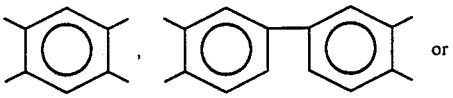  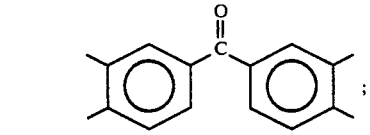

$R_2$ represents a hydrogen atom or a monovalent substituent; and m,n represent integral numbers, m/n assuming a value of from 0.1 to 100, and the film is characterized in that the ratio (a/b) of the linear expansion coefficient (a) of the film in the machine direction to the linear expansion coefficient (b) in the transverse direction is more than 0.2 but less than 1.0, and the linear expansion coefficient in the machine direction is $0.4 \times 10^{-5} - 2.0 \times 10^{-5}$ °C.$^{-1}$.

2. A method of producing a resin film defined in claim 1, characterized in that the film is drawn by a factor of 1.0 to 1.5 in the machine direction and is also drawn by a factor of 0.5 to 0.99 in the transverse direction.

* * * * *